(12) United States Patent
Tsai et al.

(10) Patent No.: US 11,243,125 B2
(45) Date of Patent: Feb. 8, 2022

(54) INTEGRATED PIEZORESISTIVE AND PIEZOELECTRIC FUSION FORCE SENSOR

(71) Applicant: NEXTINPUT, INC., Mountain View, CA (US)

(72) Inventors: Julius Minglin Tsai, San Jose, CA (US); Ryan Diestelhorst, Atlanta, GA (US); Dan Benjamin, Atlanta, GA (US)

(73) Assignee: NEXTINPUT, INC., Mountain View, CA (US)

( * ) Notice: Subject to any disclaimer, the term of this patent is extended or adjusted under 35 U.S.C. 154(b) by 171 days.

(21) Appl. No.: 16/485,026

(22) PCT Filed: Feb. 9, 2018

(86) PCT No.: PCT/US2018/017572
§ 371 (c)(1),
(2) Date: Aug. 9, 2019

(87) PCT Pub. No.: WO2018/148510
PCT Pub. Date: Aug. 16, 2018

(65) Prior Publication Data
US 2019/0383675 A1  Dec. 19, 2019

Related U.S. Application Data

(60) Provisional application No. 62/456,699, filed on Feb. 9, 2017, provisional application No. 62/462,559, filed on Feb. 23, 2017.

(51) Int. Cl.
*G01L 1/16* (2006.01)
*G01L 1/18* (2006.01)
(Continued)

(52) U.S. Cl.
CPC .................. *G01L 1/16* (2013.01); *G01L 1/18* (2013.01); *G01L 5/0028* (2013.01); *B81B 3/0072* (2013.01)

(58) Field of Classification Search
CPC . G01L 1/16; G01L 1/18; G01L 5/0028; B81B 3/0072
(Continued)

(56) References Cited

U.S. PATENT DOCUMENTS 4,594,639 A   6/1986  Kuisma
4,658,651 A   4/1987  Le
(Continued)

FOREIGN PATENT DOCUMENTS

CN   101341459 A   1/2009
CN   101458134 A   6/2009
(Continued)

OTHER PUBLICATIONS

PCT/US2018/017572, International Search Report and Written Opinion dated May 3, 2018, 9 pages.
(Continued)

*Primary Examiner* — Octavia Hollington
(74) *Attorney, Agent, or Firm* — Meunier Carlin & Curfman LLC

(57) ABSTRACT

Described herein is a ruggedized microelectromechanical ("MEMS") force sensor including both piezoresistive and piezoelectric sensing elements and integrated with complementary metal-oxide-semiconductor ("CMOS") circuitry on the same chip. The sensor employs piezoresistive strain gauges for static force and piezoelectric strain gauges for dynamic changes in force. Both piezoresistive and piezoelectric sensing elements are electrically connected to integrated circuits provided on the same substrate as the sensing elements. The integrated circuits can be configured to amplify, digitize, calibrate, store, and/or communicate force values electrical terminals to external circuitry.

17 Claims, 3 Drawing Sheets

(51) Int. Cl.
 *G01L 5/00* (2006.01)
 *B81B 3/00* (2006.01)
(58) Field of Classification Search
 USPC .................................................. 73/862.381
 See application file for complete search history.

(56) References Cited

U.S. PATENT DOCUMENTS

| | | | |
|---|---|---|---|
| 4,814,856 A | 3/1989 | Kurtz et al. |
| 4,849,730 A | 7/1989 | Izumi et al. |
| 4,914,624 A | 4/1990 | Dunthorn |
| 4,918,262 A | 4/1990 | Flowers et al. |
| 4,933,660 A | 6/1990 | Wynne |
| 4,983,786 A | 1/1991 | Stevens |
| 5,095,401 A | 3/1992 | Zavracky et al. |
| 5,159,159 A | 10/1992 | Asher |
| 5,166,612 A | 11/1992 | Murdock |
| 5,237,879 A | 8/1993 | Speeter |
| 5,320,705 A | 6/1994 | Fujii et al. |
| 5,333,505 A | 8/1994 | Takahashi et al. |
| 5,343,220 A | 8/1994 | Veasy et al. |
| 5,349,746 A | 9/1994 | Gruenwald et al. |
| 5,351,550 A | 10/1994 | Maurer |
| 5,483,994 A | 1/1996 | Maurer |
| 5,510,812 A | 4/1996 | O'Mara et al. |
| 5,541,372 A | 7/1996 | Baller et al. |
| 5,543,591 A | 8/1996 | Gillespie et al. |
| 5,565,657 A | 10/1996 | Merz |
| 5,600,074 A | 2/1997 | Marek et al. |
| 5,673,066 A | 9/1997 | Toda et al. |
| 5,773,728 A | 6/1998 | Tsukada et al. |
| 5,889,236 A | 3/1999 | Gillespie et al. |
| 5,921,896 A | 7/1999 | Boland |
| 5,969,591 A | 10/1999 | Fung |
| 6,028,271 A | 2/2000 | Gillespie et al. |
| 6,159,166 A | 12/2000 | Chesney et al. |
| 6,243,075 B1 | 6/2001 | Fishkin et al. |
| 6,348,663 B1 | 2/2002 | Schoos et al. |
| 6,351,205 B1 | 2/2002 | Armstrong |
| 6,360,598 B1 | 3/2002 | Calame et al. |
| 6,437,682 B1 | 8/2002 | Vance |
| 6,555,235 B1 | 4/2003 | Aufderheide et al. |
| 6,556,189 B1 | 4/2003 | Takahata et al. |
| 6,569,108 B2 | 5/2003 | Sarvazyan et al. |
| 6,610,936 B2 | 8/2003 | Gillespie et al. |
| 6,620,115 B2 | 9/2003 | Sarvazyan et al. |
| 6,629,343 B1 | 10/2003 | Chesney et al. |
| 6,668,230 B2 | 12/2003 | Mansky et al. |
| 6,720,712 B2 | 4/2004 | Scott et al. |
| 6,788,297 B2 | 9/2004 | Itoh et al. |
| 6,801,191 B2 | 10/2004 | Mukai et al. |
| 6,809,280 B2 | 10/2004 | Divigalpitiya et al. |
| 6,812,621 B2 | 11/2004 | Scott |
| 6,822,640 B2 | 11/2004 | Derocher |
| 6,868,731 B1 | 3/2005 | Gatesman |
| 6,879,318 B1 | 4/2005 | Chan et al. |
| 6,888,537 B2 | 5/2005 | Benson et al. |
| 6,915,702 B2 | 7/2005 | Omura et al. |
| 6,931,938 B2 | 8/2005 | Knirck et al. |
| 6,995,752 B2 | 2/2006 | Lu |
| 7,138,984 B1 | 11/2006 | Miles |
| 7,173,607 B2 | 2/2007 | Matsumoto et al. |
| 7,190,350 B2 | 3/2007 | Roberts |
| 7,215,329 B2 | 5/2007 | Yoshikawa et al. |
| 7,218,313 B2 | 5/2007 | Marcus et al. |
| 7,224,257 B2 | 5/2007 | Morikawa |
| 7,245,293 B2 | 7/2007 | Hoshino et al. |
| 7,273,979 B2 | 9/2007 | Christensen |
| 7,280,097 B2 | 10/2007 | Chen et al. |
| 7,318,349 B2 | 1/2008 | Vaganov et al. |
| 7,324,094 B2 | 1/2008 | Moilanen et al. |
| 7,324,095 B2 | 1/2008 | Sharma |
| 7,336,260 B2 | 2/2008 | Martin et al. |
| 7,337,085 B2 | 2/2008 | Soss |
| 7,345,680 B2 | 3/2008 | David |
| 7,367,232 B2 | 5/2008 | Vaganov |
| 7,406,661 B2 | 7/2008 | Väänänen et al. |
| 7,425,749 B2 | 9/2008 | Hartzell et al. |
| 7,426,873 B1 | 9/2008 | Kholwadwala et al. |
| 7,449,758 B2 | 11/2008 | Axelrod et al. |
| 7,460,109 B2 | 12/2008 | Safai et al. |
| 7,476,952 B2 | 1/2009 | Vaganov et al. |
| 7,508,040 B2 | 3/2009 | Nikkei et al. |
| 7,554,167 B2 | 6/2009 | Vaganov |
| 7,607,111 B2 | 10/2009 | Vaananen et al. |
| 7,620,521 B2 | 11/2009 | Breed et al. |
| 7,629,969 B2 | 12/2009 | Kent |
| 7,649,522 B2 | 1/2010 | Chen et al. |
| 7,663,612 B2 | 2/2010 | Bladt |
| 7,685,538 B2 | 3/2010 | Fleck et al. |
| 7,698,084 B2 | 4/2010 | Soss |
| 7,701,445 B2 | 4/2010 | Inokawa et al. |
| 7,746,327 B2 | 6/2010 | Miyakoshi |
| 7,791,151 B2 | 9/2010 | Vaganov et al. |
| 7,819,998 B2 | 10/2010 | David |
| 7,825,911 B2 | 11/2010 | Sano et al. |
| 7,903,090 B2 | 3/2011 | Soss et al. |
| 7,921,725 B2 | 4/2011 | Silverbrook et al. |
| 7,952,566 B2 | 5/2011 | Poupyrev et al. |
| 7,973,772 B2 | 7/2011 | Gettemy et al. |
| 7,973,778 B2 | 7/2011 | Chen |
| 8,004,052 B2 | 8/2011 | Vaganov |
| 8,004,501 B2 | 8/2011 | Harrison |
| 8,013,843 B2 | 9/2011 | Pryor |
| 8,026,906 B2 | 9/2011 | Mölne et al. |
| 8,044,929 B2 | 10/2011 | Baldo et al. |
| 8,068,100 B2 | 11/2011 | Pryor |
| 8,072,437 B2 | 12/2011 | Miller et al. |
| 8,072,440 B2 | 12/2011 | Pryor |
| 8,096,188 B2 | 1/2012 | Wilner |
| 8,113,065 B2 | 2/2012 | Ohsato et al. |
| 8,120,586 B2 | 2/2012 | Hsu et al. |
| 8,120,588 B2 | 2/2012 | Klinghult |
| 8,130,207 B2 | 3/2012 | Nurmi et al. |
| 8,134,535 B2 | 3/2012 | Choi et al. |
| 8,139,038 B2 | 3/2012 | Chueh et al. |
| 8,144,133 B2 | 3/2012 | Wang et al. |
| 8,149,211 B2 | 4/2012 | Hayakawa et al. |
| 8,154,528 B2 | 4/2012 | Chen et al. |
| 8,159,473 B2 | 4/2012 | Cheng et al. |
| 8,164,573 B2 | 4/2012 | DaCosta et al. |
| 8,183,077 B2 | 5/2012 | Vaganov et al. |
| 8,184,093 B2 | 5/2012 | Tsuiki |
| 8,188,985 B2 | 5/2012 | Hillis et al. |
| 8,199,116 B2 | 6/2012 | Jeon et al. |
| 8,212,790 B2 | 7/2012 | Rimas-Ribikauskas et al. |
| 8,237,537 B2 | 8/2012 | Kurtz et al. |
| 8,243,035 B2 | 8/2012 | Abe et al. |
| 8,250,921 B2 | 8/2012 | Nasiri et al. |
| 8,253,699 B2 | 8/2012 | Son |
| 8,260,337 B2 | 9/2012 | Periyalwar et al. |
| 8,269,731 B2 | 9/2012 | Mölne |
| 8,289,288 B2 | 10/2012 | Whytock et al. |
| 8,289,290 B2 | 10/2012 | Klinghult |
| 8,297,127 B2 | 10/2012 | Wade et al. |
| 8,319,739 B2 | 11/2012 | Chu et al. |
| 8,325,143 B2 | 12/2012 | Destura et al. |
| 8,350,345 B2 | 1/2013 | Vaganov |
| 8,363,020 B2 | 1/2013 | Li et al. |
| 8,363,022 B2 | 1/2013 | Tho et al. |
| 8,378,798 B2 | 2/2013 | Bells et al. |
| 8,378,991 B2 | 2/2013 | Jeon et al. |
| 8,384,677 B2 | 2/2013 | Mak-Fan et al. |
| 8,387,464 B2 | 3/2013 | McNeil et al. |
| 8,405,631 B2 | 3/2013 | Chu et al. |
| 8,405,632 B2 | 3/2013 | Chu et al. |
| 8,421,609 B2 | 4/2013 | Kim et al. |
| 8,427,441 B2 | 4/2013 | Paleczny et al. |
| 8,436,806 B2 | 5/2013 | Almalki et al. |
| 8,436,827 B1 | 5/2013 | Zhai et al. |
| 8,451,245 B2 | 5/2013 | Heubel et al. |
| 8,456,440 B2 | 6/2013 | Abe et al. |
| 8,466,889 B2 | 6/2013 | Tong et al. |
| 8,477,115 B2 | 7/2013 | Rekimoto |

(56) References Cited

U.S. PATENT DOCUMENTS

| | | |
|---|---|---|
| 8,482,372 B2 | 7/2013 | Kurtz et al. |
| 8,493,189 B2 | 7/2013 | Suzuki |
| 8,497,757 B2 | 7/2013 | Kurtz et al. |
| 8,516,906 B2 | 8/2013 | Umetsu et al. |
| 8,931,347 B2 | 1/2015 | Donzier et al. |
| 8,973,446 B2 | 3/2015 | Fukuzawa et al. |
| 8,984,951 B2 | 3/2015 | Landmann et al. |
| 9,097,600 B2 | 8/2015 | Khandani |
| 9,487,388 B2 | 11/2016 | Brosh |
| 9,493,342 B2 | 11/2016 | Brosh |
| 9,709,509 B1 | 7/2017 | Yang et al. |
| 9,772,245 B2 | 9/2017 | Besling et al. |
| 10,962,427 B2 * | 3/2021 | Youssefi ............... B81B 3/0072 |
| 2003/0067448 A1 | 4/2003 | Park |
| 2003/0128181 A1 | 7/2003 | Poole |
| 2003/0189552 A1 | 10/2003 | Chuang et al. |
| 2004/0012572 A1 | 1/2004 | Sowden et al. |
| 2004/0140966 A1 | 7/2004 | Marggraff et al. |
| 2005/0083310 A1 | 4/2005 | Safai et al. |
| 2005/0190152 A1 | 9/2005 | Vaganov |
| 2006/0028441 A1 | 2/2006 | Armstrong |
| 2006/0244733 A1 | 11/2006 | Geaghan |
| 2006/0272413 A1 | 12/2006 | Vaganov et al. |
| 2006/0284856 A1 | 12/2006 | Soss |
| 2007/0035525 A1 | 2/2007 | Yeh et al. |
| 2007/0046649 A1 | 3/2007 | Reiner |
| 2007/0070046 A1 | 3/2007 | Sheynblat et al. |
| 2007/0070053 A1 | 3/2007 | Lapstun et al. |
| 2007/0097095 A1 | 5/2007 | Kim et al. |
| 2007/0103449 A1 | 5/2007 | Laitinen et al. |
| 2007/0103452 A1 | 5/2007 | Wakai et al. |
| 2007/0115265 A1 | 5/2007 | Rainisto |
| 2007/0132717 A1 | 6/2007 | Wang et al. |
| 2007/0137901 A1 | 6/2007 | Chen |
| 2007/0139391 A1 | 6/2007 | Bischoff |
| 2007/0152959 A1 | 7/2007 | Peters |
| 2007/0156723 A1 | 7/2007 | Vaananen |
| 2007/0182864 A1 | 8/2007 | Stoneham et al. |
| 2007/0229478 A1 | 10/2007 | Rosenberg et al. |
| 2007/0235231 A1 | 10/2007 | Loomis et al. |
| 2007/0245836 A1 | 10/2007 | Vaganov |
| 2007/0262965 A1 | 11/2007 | Hirai et al. |
| 2007/0277616 A1 | 12/2007 | Nikkel et al. |
| 2007/0298883 A1 | 12/2007 | Feldman et al. |
| 2008/0001923 A1 | 1/2008 | Hall et al. |
| 2008/0007532 A1 | 1/2008 | Chen |
| 2008/0010616 A1 | 1/2008 | Algreatly |
| 2008/0024454 A1 | 1/2008 | Everest |
| 2008/0030482 A1 | 2/2008 | Elwell et al. |
| 2008/0036743 A1 | 2/2008 | Westerman et al. |
| 2008/0083962 A1 | 4/2008 | Vaganov |
| 2008/0088600 A1 | 4/2008 | Prest et al. |
| 2008/0088602 A1 | 4/2008 | Hotelling |
| 2008/0094367 A1 | 4/2008 | Van De Ven et al. |
| 2008/0105057 A1 | 5/2008 | Wade |
| 2008/0105470 A1 | 5/2008 | Van De Ven et al. |
| 2008/0106523 A1 | 5/2008 | Conrad |
| 2008/0174852 A1 | 7/2008 | Hirai et al. |
| 2008/0180402 A1 | 7/2008 | Yoo et al. |
| 2008/0180405 A1 | 7/2008 | Han et al. |
| 2008/0180406 A1 | 7/2008 | Han et al. |
| 2008/0202249 A1 | 8/2008 | Yokura et al. |
| 2008/0204427 A1 | 8/2008 | Heesemans et al. |
| 2008/0211766 A1 | 9/2008 | Westerman et al. |
| 2008/0238446 A1 | 10/2008 | DeNatale et al. |
| 2008/0238884 A1 | 10/2008 | Harish |
| 2008/0259046 A1 | 10/2008 | Carsanaro |
| 2008/0284742 A1 | 11/2008 | Prest et al. |
| 2008/0303799 A1 | 12/2008 | Schwesig et al. |
| 2009/0027352 A1 | 1/2009 | Abele |
| 2009/0027353 A1 | 1/2009 | Im et al. |
| 2009/0046110 A1 | 2/2009 | Sadler et al. |
| 2009/0102805 A1 | 4/2009 | Meijer et al. |
| 2009/0140985 A1 | 6/2009 | Liu |
| 2009/0184921 A1 | 7/2009 | Scott et al. |
| 2009/0184936 A1 | 7/2009 | Algreatly |
| 2009/0213066 A1 | 8/2009 | Hardacker et al. |
| 2009/0237275 A1 | 9/2009 | Vaganov |
| 2009/0237374 A1 | 9/2009 | Li et al. |
| 2009/0242282 A1 | 10/2009 | Kim et al. |
| 2009/0243817 A1 | 10/2009 | Son |
| 2009/0243998 A1 | 10/2009 | Wang |
| 2009/0256807 A1 | 10/2009 | Nurmi |
| 2009/0256817 A1 | 10/2009 | Perlin et al. |
| 2009/0282930 A1 | 11/2009 | Cheng et al. |
| 2009/0303400 A1 | 12/2009 | Hou et al. |
| 2009/0309852 A1 | 12/2009 | Lin et al. |
| 2009/0314551 A1 | 12/2009 | Nakajima |
| 2010/0013785 A1 | 1/2010 | Murai et al. |
| 2010/0020030 A1 | 1/2010 | Kim et al. |
| 2010/0020039 A1 | 1/2010 | Ricks et al. |
| 2010/0039396 A1 | 2/2010 | Ho et al. |
| 2010/0053087 A1 | 3/2010 | Dai et al. |
| 2010/0053116 A1 | 3/2010 | Daverman et al. |
| 2010/0066686 A1 | 3/2010 | Joguet et al. |
| 2010/0066697 A1 | 3/2010 | Jacomet et al. |
| 2010/0079391 A1 | 4/2010 | Joung |
| 2010/0079395 A1 | 4/2010 | Kim et al. |
| 2010/0079398 A1 | 4/2010 | Shen et al. |
| 2010/0097347 A1 | 4/2010 | Lin |
| 2010/0102403 A1 | 4/2010 | Celik-Butler et al. |
| 2010/0117978 A1 | 5/2010 | Shirado |
| 2010/0123671 A1 | 5/2010 | Lee |
| 2010/0123686 A1 | 5/2010 | Klinghult et al. |
| 2010/0127140 A1 | 5/2010 | Smith |
| 2010/0128002 A1 | 5/2010 | Stacy et al. |
| 2010/0153891 A1 | 6/2010 | Vaananen et al. |
| 2010/0164959 A1 | 7/2010 | Brown et al. |
| 2010/0220065 A1 | 9/2010 | Ma |
| 2010/0271325 A1 | 10/2010 | Conte et al. |
| 2010/0289807 A1 | 11/2010 | Yu et al. |
| 2010/0295807 A1 | 11/2010 | Xie et al. |
| 2010/0308844 A1 | 12/2010 | Day et al. |
| 2010/0309714 A1 | 12/2010 | Meade |
| 2010/0315373 A1 | 12/2010 | Steinhauser et al. |
| 2010/0321310 A1 | 12/2010 | Kim et al. |
| 2010/0321319 A1 | 12/2010 | Hefti et al. |
| 2010/0323467 A1 | 12/2010 | Vaganov et al. |
| 2010/0328229 A1 | 12/2010 | Weber et al. |
| 2010/0328230 A1 | 12/2010 | Faubert et al. |
| 2011/0001723 A1 | 1/2011 | Fan |
| 2011/0006980 A1 | 1/2011 | Taniguchi et al. |
| 2011/0007008 A1 | 1/2011 | Algreatly |
| 2011/0012848 A1 | 1/2011 | Li et al. |
| 2011/0018820 A1 | 1/2011 | Huitema et al. |
| 2011/0032211 A1 | 2/2011 | Christoffersen |
| 2011/0039602 A1 | 2/2011 | McNamara et al. |
| 2011/0050628 A1 | 3/2011 | Homma et al. |
| 2011/0050630 A1 | 3/2011 | Ikeda |
| 2011/0057899 A1 | 3/2011 | Sleeman et al. |
| 2011/0063248 A1 | 3/2011 | Yoon |
| 2011/0113881 A1 | 5/2011 | Suzuki |
| 2011/0128250 A1 | 6/2011 | Murphy et al. |
| 2011/0141052 A1 | 6/2011 | Bernstein et al. |
| 2011/0141053 A1 | 6/2011 | Bulea et al. |
| 2011/0187674 A1 | 8/2011 | Baker et al. |
| 2011/0209555 A1 | 9/2011 | Ahles et al. |
| 2011/0227836 A1 | 9/2011 | Li et al. |
| 2011/0242014 A1 | 10/2011 | Tsai et al. |
| 2011/0267181 A1 | 11/2011 | Kildal |
| 2011/0267294 A1 | 11/2011 | Kildal |
| 2011/0273396 A1 | 11/2011 | Chung |
| 2011/0291951 A1 | 12/2011 | Tong |
| 2011/0298705 A1 | 12/2011 | Vaganov |
| 2011/0308324 A1 | 12/2011 | Gamage et al. |
| 2012/0032907 A1 | 2/2012 | Koizumi et al. |
| 2012/0032915 A1 | 2/2012 | Wittorf |
| 2012/0038579 A1 | 2/2012 | Sasaki |
| 2012/0044169 A1 | 2/2012 | Enami |
| 2012/0044172 A1 | 2/2012 | Ohki et al. |
| 2012/0050159 A1 | 3/2012 | Yu et al. |
| 2012/0050208 A1 | 3/2012 | Dietz |
| 2012/0056837 A1 | 3/2012 | Park et al. |
| 2012/0060605 A1 | 3/2012 | Wu et al. |

(56) References Cited

U.S. PATENT DOCUMENTS

| | | |
|---|---|---|
| 2012/0061823 A1 | 3/2012 | Wu et al. |
| 2012/0062603 A1 | 3/2012 | Mizunuma et al. |
| 2012/0068946 A1 | 3/2012 | Tang et al. |
| 2012/0068969 A1 | 3/2012 | Bogana et al. |
| 2012/0081327 A1 | 4/2012 | Heubel et al. |
| 2012/0086659 A1 | 4/2012 | Perlin et al. |
| 2012/0092250 A1 | 4/2012 | Hadas et al. |
| 2012/0092279 A1 | 4/2012 | Martin |
| 2012/0092294 A1 | 4/2012 | Ganapathi et al. |
| 2012/0092299 A1 | 4/2012 | Harada et al. |
| 2012/0092324 A1 | 4/2012 | Buchan et al. |
| 2012/0105358 A1 | 5/2012 | Momeyer et al. |
| 2012/0105367 A1 | 5/2012 | Son et al. |
| 2012/0113061 A1 | 5/2012 | Ikeda |
| 2012/0127088 A1 | 5/2012 | Pance et al. |
| 2012/0127107 A1 | 5/2012 | Miyashita et al. |
| 2012/0139864 A1 | 6/2012 | Sleeman et al. |
| 2012/0144921 A1 | 6/2012 | Bradley et al. |
| 2012/0146945 A1 | 6/2012 | Miyazawa et al. |
| 2012/0146946 A1 | 6/2012 | Wang et al. |
| 2012/0147052 A1 | 6/2012 | Homma et al. |
| 2012/0154315 A1 | 6/2012 | Aono |
| 2012/0154316 A1 | 6/2012 | Kono |
| 2012/0154317 A1 | 6/2012 | Aono |
| 2012/0154318 A1 | 6/2012 | Aono |
| 2012/0154328 A1 | 6/2012 | Kono |
| 2012/0154329 A1 | 6/2012 | Shinozaki |
| 2012/0154330 A1 | 6/2012 | Shimizu |
| 2012/0162122 A1 | 6/2012 | Geaghan |
| 2012/0169609 A1 | 7/2012 | Britton |
| 2012/0169617 A1 | 7/2012 | Mäenpää |
| 2012/0169635 A1 | 7/2012 | Liu |
| 2012/0169636 A1 | 7/2012 | Liu |
| 2012/0188181 A1 | 7/2012 | Ha et al. |
| 2012/0194460 A1 | 8/2012 | Kuwabara et al. |
| 2012/0194466 A1 | 8/2012 | Posamentier |
| 2012/0200526 A1 | 8/2012 | Lackey |
| 2012/0204653 A1 | 8/2012 | August et al. |
| 2012/0205165 A1 | 8/2012 | Strittmatter et al. |
| 2012/0218212 A1 | 8/2012 | Yu et al. |
| 2012/0234112 A1 | 9/2012 | Umetsu et al. |
| 2012/0256237 A1 | 10/2012 | Lakamraju et al. |
| 2012/0286379 A1 | 11/2012 | Inoue |
| 2012/0319987 A1 | 12/2012 | Woo |
| 2012/0327025 A1 | 12/2012 | Huska et al. |
| 2013/0008263 A1 | 1/2013 | Kabasawa et al. |
| 2013/0038541 A1 | 2/2013 | Bakker |
| 2013/0093685 A1 | 4/2013 | Kalu et al. |
| 2013/0096849 A1 | 4/2013 | Campbell et al. |
| 2013/0140944 A1 | 6/2013 | Chen et al. |
| 2013/0187201 A1 | 7/2013 | Elian |
| 2013/0239700 A1* | 9/2013 | Benfield ............... G01L 5/162 73/862.044 |
| 2013/0255393 A1 | 10/2013 | Fukuzawa et al. |
| 2013/0341741 A1 | 12/2013 | Brosh |
| 2013/0341742 A1 | 12/2013 | Brosh |
| 2014/0007705 A1 | 1/2014 | Campbell et al. |
| 2014/0028575 A1 | 1/2014 | Parivar et al. |
| 2014/0055407 A1 | 2/2014 | Lee et al. |
| 2014/0090488 A1 | 4/2014 | Taylor et al. |
| 2014/0283604 A1* | 9/2014 | Najafi ............... G01P 15/125 73/514.32 |
| 2014/0367811 A1 | 12/2014 | Nakagawa et al. |
| 2015/0110295 A1 | 4/2015 | Jenkner et al. |
| 2016/0069927 A1 | 3/2016 | Hamamura |
| 2016/0245667 A1* | 8/2016 | Najafi ............... G01C 25/005 |
| 2016/0332866 A1 | 11/2016 | Brosh et al. |
| 2016/0363490 A1 | 12/2016 | Campbell et al. |
| 2017/0103246 A1 | 4/2017 | Pi et al. |
| 2017/0234744 A1 | 8/2017 | Tung et al. |
| 2019/0383676 A1 | 12/2019 | Foughi et al. |
| 2020/0149983 A1 | 5/2020 | Tsai et al. |
| 2020/0234023 A1 | 7/2020 | Tsai et al. |

FOREIGN PATENT DOCUMENTS

| | | |
|---|---|---|
| CN | 101801837 A | 8/2010 |
| CN | 201653605 | 11/2010 |
| CN | 101929898 A | 12/2010 |
| CN | 102062662 A | 5/2011 |
| CN | 102998037 | 3/2013 |
| CN | 103308239 A | 9/2013 |
| CN | 102853950 A | 3/2015 |
| CN | 104535229 | 4/2015 |
| CN | 104581605 A | 4/2015 |
| CN | 104919293 A | 9/2015 |
| CN | 105934661 A | 9/2016 |
| DE | 102010012441 | 9/2011 |
| JP | 2004-156937 | 6/2004 |
| JP | 2010147268 | 7/2010 |
| WO | 93/10430 A | 5/1993 |
| WO | 2004/113859 | 12/2004 |
| WO | 2007/139695 | 12/2007 |
| WO | 2011/065250 A1 | 6/2011 |
| WO | 2013067548 A1 | 5/2013 |
| WO | 2019/023552 | 1/2019 |

OTHER PUBLICATIONS

Mei, T., et al., "Design and Fabrication of an Integrated Three-Dimensional Tactile Sensor for Space Robotic Applications," Micro Electro Mechanical Systems, MEMS '99, Twelfth IEEE International Conference, Orlando Florida, Jan. 21, 1999, pp. 112-117.

Nesterov, V., et al., "Modelling and investigation of the silicon twin design 3D micro probe," Journal of Micromechanics and Microengineering, vol. 15, 2005, pp. 514-520.

* cited by examiner

US 11,243,125 B2

INTEGRATED PIEZORESISTIVE AND PIEZOELECTRIC FUSION FORCE SENSOR

CROSS-REFERENCE TO RELATED APPLICATIONS

This application is a 35 USC 371 national phase application of PCT/US2018/017572 filed on Feb. 9, 2018, which claims the benefit of U.S. provisional patent application No. 62/456,699, filed on Feb. 9, 2017, and entitled "INTEGRATED DIGITAL FORCE SENSOR," and U.S. provisional patent application No. 62/462,559, filed on Feb. 23, 2017, and entitled "INTEGRATED PIEZORESISTIVE AND PIEZOELECTRIC FUSION FORCE SENSOR," the disclosures of which are expressly incorporated herein by reference in their entireties.

FIELD OF TECHNOLOGY

The present disclosure relates to microelectromechanical ("MEMS") force sensing with piezoresistive and piezoelectric sensor integrated with complementary metal-oxide-semiconductor ("CMOS") circuitry.

BACKGROUND

Force sensing touch panels are realized with force sensors underneath the display area with certain sensor array arrangements. These touch panels require the force sensors to provide high quality signals, meaning high sensitivity is essential. Existing MEMS piezoresistive sensors are suitable for such applications and are typically paired with extremely low noise amplifiers due to the low sensitivity of the sensors. Such amplifiers are expensive and tend to consume a lot of power. Piezoelectric sensors are highly sensitive in force sensing applications, but only for dynamic changes in force (i.e., not static forces). Therefore, piezoelectric sensors cannot provide accurate offset information.

Accordingly, there is a need in the pertinent art for a low power, high sensitivity force sensor capable of sensing both static and dynamic force with high sensitivity and accuracy.

SUMMARY

A MEMS force sensor including both piezoresistive and piezoelectric sensing elements on the same chip is described herein. The force sensor can also include integrated circuits (e.g., digital circuitry) on the same chip. In one implementation, the force sensor is configured in a chip scale package ("CSP") format. A plurality of piezoresistive sensing elements are implemented on the silicon substrate of the integrated circuit chip. In addition, a plurality of piezoelectric elements are disposed between the metal pads and solder bumps, where the force is directly transduced for sensing.

The MEMS force sensor can be manufactured by first diffusing or implanting the piezoresistive sensing elements on a silicon substrate. Then, the standard integrated circuit process (e.g., CMOS process) can follow to provide digital circuitry on the same silicon substrate. The overall thermal budget can be considered such that the piezoresistive sensing elements can maintain their required doping profile. After the integrated circuit process is completed, the piezoelectric layer along with two electrode layers (e.g., a piezoelectric sensing element) are then disposed and patterned on the silicon substrate. Solder bumps are then formed on the metal pads and the wafer is diced to create a chip scale packaged device. The force exerted on the back side of the device induces strain in both the plurality of piezoresistive sensing elements and the plurality of piezoelectric sensing elements, which produce respective output signals proportional to the force. The output signals can be digitized by the integrated circuitry and stored in on-chip buffers until requested by a host device.

An example microelectromechanical ("MEMS") force sensor is described herein. The MEMS force sensor can include a sensor die configured to receive an applied force. The sensor die has a top surface and a bottom surface opposite thereto. The MEMS force sensor can also include a piezoresistive sensing element, a piezoelectric sensing element, and digital circuitry arranged on the bottom surface of the sensor die. The piezoresistive sensing element is configured to convert a strain to a first analog electrical signal that is proportional to the strain. The piezoelectric sensing element is configured to convert a change in strain to a second analog electrical signal that is proportional to the change in strain. The digital circuitry is configured to convert the first and second analog electrical signals to respective digital electrical output signals.

Additionally, the piezoresistive sensing element can be formed by diffusion or implantation. Alternatively, the piezoresistive sensing element can be formed by polysilicon processes from an integrated circuit process.

Alternatively or additionally, the MEMS force sensor can include a solder ball arranged on the bottom surface of the sensor die. The piezoelectric sensing element can be disposed between the solder ball and the sensor die.

Alternatively or additionally, the MEMS force sensor can include a plurality of electrical terminals arranged on the bottom surface of the sensor die. The respective digital electrical output signals produced by the digital circuitry can be routed to the electrical terminals. The electrical terminals can be solder bumps or copper pillars.

Alternatively or additionally, the digital circuitry can be further configured to use the second analog electrical signal produced by the piezoelectric sensing element and the first analog electrical signal produced by the piezoresistive sensing element in conjunction to improve sensitivity and accuracy. For example, the first analog electrical signal produced by the piezoresistive sensing element can measure static force applied to the MEMS force sensor, and the second analog electrical signal produced by the piezoelectric sensing element can measure dynamic force applied to the MEMS force sensor.

Alternatively or additionally, the MEMS force sensor can include a cap attached to the sensor die at a surface defined by an outer wall of the sensor die. A sealed cavity can be formed between the cap and the sensor die.

Alternatively or additionally, the sensor die can include a flexure formed therein. The flexure can convert the applied force into the strain on the bottom surface of the sensor die.

Alternatively or additionally, a gap can be arranged between the sensor die and the cap. The gap can be configured to narrow with application of the applied force such that the flexure is unable to deform beyond its breaking point.

Alternatively or additionally, the MEMS force sensor can include an inter-metal dielectric layer arranged on the bottom surface of the sensor die. The piezoelectric sensing element can be arranged on the inter-metal dielectric layer.

Alternatively or additionally, the digital circuitry can be further configured to store the respective digital electrical output signals to a buffer.

Other systems, methods, features and/or advantages will be or may become apparent to one with skill in the art upon examination of the following drawings and detailed description. It is intended that all such additional systems, methods, features and/or advantages be included within this description and be protected by the accompanying claims.

BRIEF DESCRIPTION OF THE FIGURES

The components in the drawings are not necessarily to scale relative to each other. Like reference numerals designate corresponding parts throughout the several views. These and other features of will become more apparent in the detailed description in which reference is made to the appended drawings.

DETAILED DESCRIPTION

The present disclosure can be understood more readily by reference to the following detailed description, examples, drawings, and their previous and following description. However, before the present devices, systems, and/or methods are disclosed and described, it is to be understood that this disclosure is not limited to the specific devices, systems, and/or methods disclosed unless otherwise specified, and, as such, can, of course, vary. It is also to be understood that the terminology used herein is for the purpose of describing particular aspects only and is not intended to be limiting.

The following description is provided as an enabling teaching. To this end, those skilled in the relevant art will recognize and appreciate that many changes can be made, while still obtaining beneficial results. It will also be apparent that some of the desired benefits can be obtained by selecting some of the features without utilizing other features. Accordingly, those who work in the art will recognize that many modifications and adaptations may be possible and can even be desirable in certain circumstances, and are contemplated by this disclosure. Thus, the following description is provided as illustrative of the principles and not in limitation thereof.

As used throughout, the singular forms "a," "an" and "the" include plural referents unless the context clearly dictates otherwise. Thus, for example, reference to "a force sensor" can include two or more such force sensors unless the context indicates otherwise.

The term "comprising" and variations thereof as used herein is used synonymously with the term "including" and variations thereof and are open, non-limiting terms.

Ranges can be expressed herein as from "about" one particular value, and/or to "about" another particular value. When such a range is expressed, another aspect includes from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint.

As used herein, the terms "optional" or "optionally" mean that the subsequently described event or circumstance may or may not occur, and that the description includes instances where said event or circumstance occurs and instances where it does not.

Figure 1A:
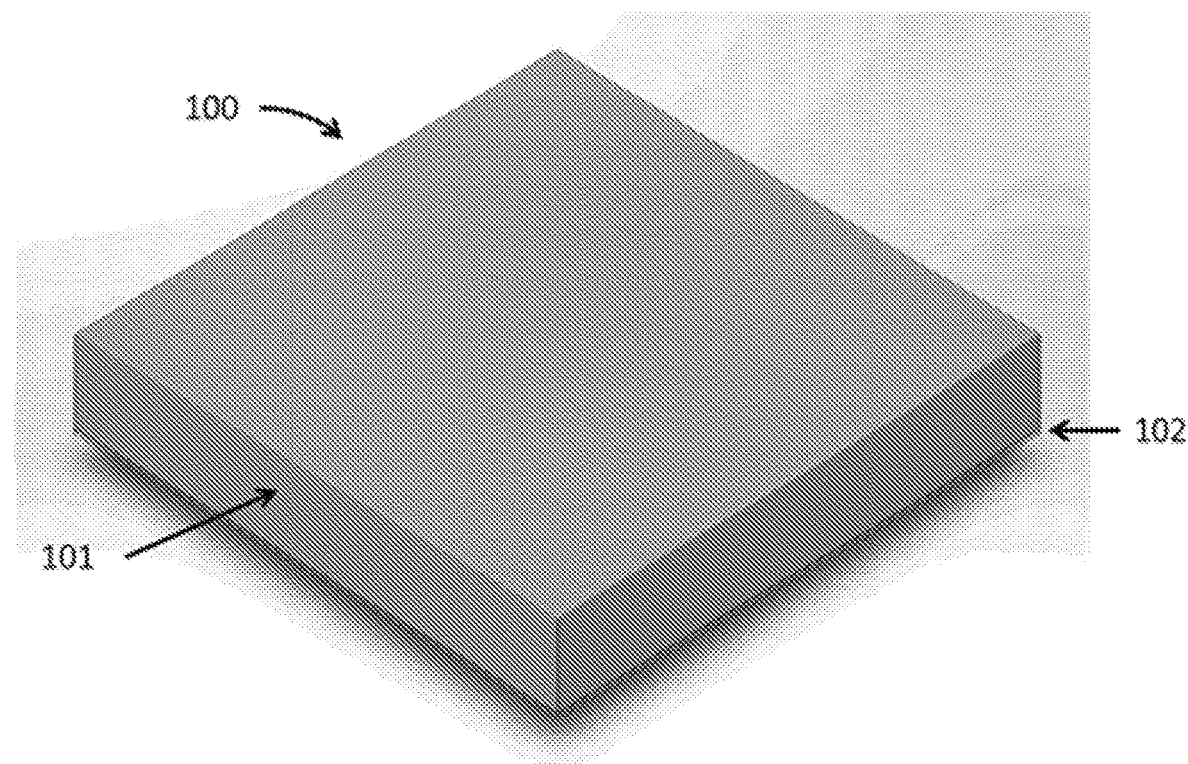
FIG. 1A is an isometric view of the top of an example MEMS force sensor according to implementations described herein.
Figure 1B:
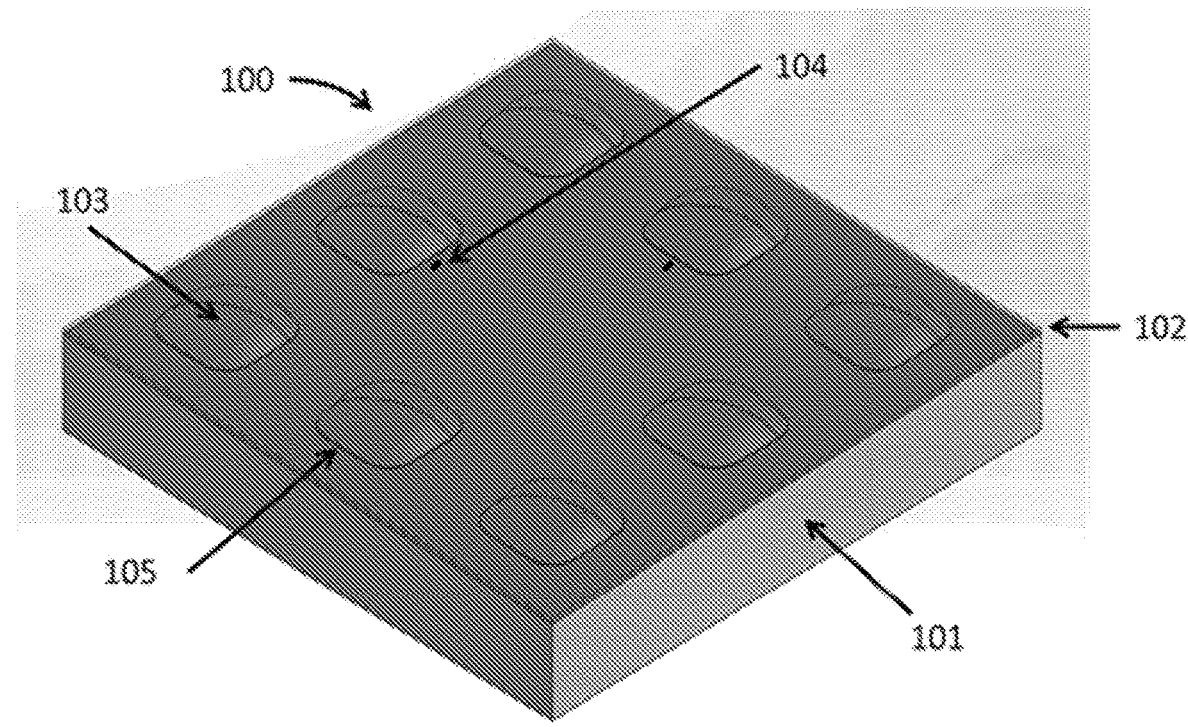
FIG. 1B is an isometric view of the bottom of the MEMS force sensor of FIG. 1.

A MEMS force sensor 100 for measuring a force applied to at least a portion thereof is described herein. In one aspect, as depicted in FIG. 1A, the force sensor device 100 includes a substrate 101 and inter-metal dielectric layer (IMD) 102 fabricated on a surface (e.g., bottom surface) of the substrate 101 to form integrated circuits. The substrate 101 can optionally be made of silicon. Optionally, the substrate 101 (and its components such as, for example, boss, mesa, outer wall, flexure(s), etc.) is a single continuous piece of material, i.e., the substrate is monolithic. It should be understood that this disclosure contemplates that the substrate can be made from materials other than those provided as examples. In another aspect, as depicted in FIG. 1B, the MEMS force sensor 100 is formed into a chip scale package with solder bumps 103 and a plurality of piezoresistive sensing elements 104. The solder bumps 103 and the piezoresistive sensing elements 104 can be formed on the same surface (e.g., bottom surface) of the substrate 101 on which the IMD layer 102 is fabricated. The piezoresistive sensing elements 104 are configured to convert a strain to an analog electrical signal (e.g., a first analog electrical signal) that is proportional to the strain on the bottom surface of the substrate 101. The piezoresistive sensing elements 104 detect static forces applied to the MEMS force sensor 100. This disclosure contemplates that the piezoresistive sensing elements 104 can be diffused, deposited, or implanted on the bottom surface of substrate 101.

The piezoresistive sensing elements 104 can change resistance in response to deflection of a portion of the substrate 101. For example, as strain is induced in the bottom surface of the substrate 101 proportional to the force applied to the MEMS force sensor 100, a localized strain is produced on a piezoresistive sensing element such that the piezoresistive sensing element experiences compression or tension, depending on its specific orientation. As the piezoresistive sensing element compresses and tenses, its resistivity changes in opposite fashion. Accordingly, a Wheatstone bridge circuit including a plurality (e.g., four) piezoresistive sensing elements (e.g., two of each orientation relative to strain) becomes unbalanced and produces a differential voltage (also sometimes referred to herein as the "first analog electrical signal") across the positive signal terminal and the negative signal terminal. This differential voltage is directly proportional to the force applied to the MEMS force sensor 100. As described below, this differential voltage can be received at and processed by digital circuitry (e.g., as shown in FIGS. 2-5). For example, the digital circuitry can be configured to, among other functions, convert the first analog electrical signal to a digital electrical output signal.

Example MEMS force sensors using piezoresistive sensing elements are described in U.S. Pat. No. 9,487,388, issued Nov. 8, 2016 and entitled "Ruggedized MEMS Force Die;" U.S. Pat. No. 9,493,342, issued Nov. 15, 2016 and entitled "Wafer Level MEMS Force Dies;" U.S. Patent Application Publication No. 2016/0332866 to Brosh et al., filed Jan. 13, 2015 and entitled "Miniaturized and ruggedized wafer level mems force sensors;" and U.S. Patent Application Publication No. 2016/0363490 to Campbell et al., filed Jun. 10, 2016 and entitled "Ruggedized wafer level mems force sensor with a tolerance trench," the disclosures of which are incorporated by reference in their entireties.

Figure 2:
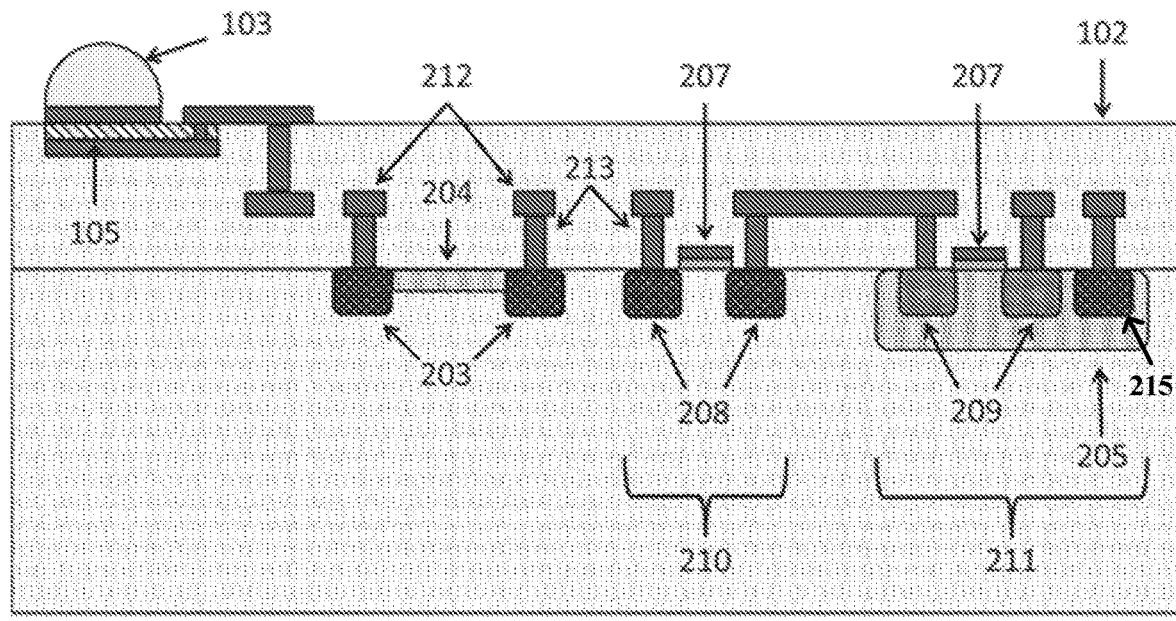
FIG. 2 is a cross-sectional view of an integrated p-type MEMS-CMOS force sensor using a piezoresistive sensing element (not to scale) according to implementations described herein.
Figure 3:
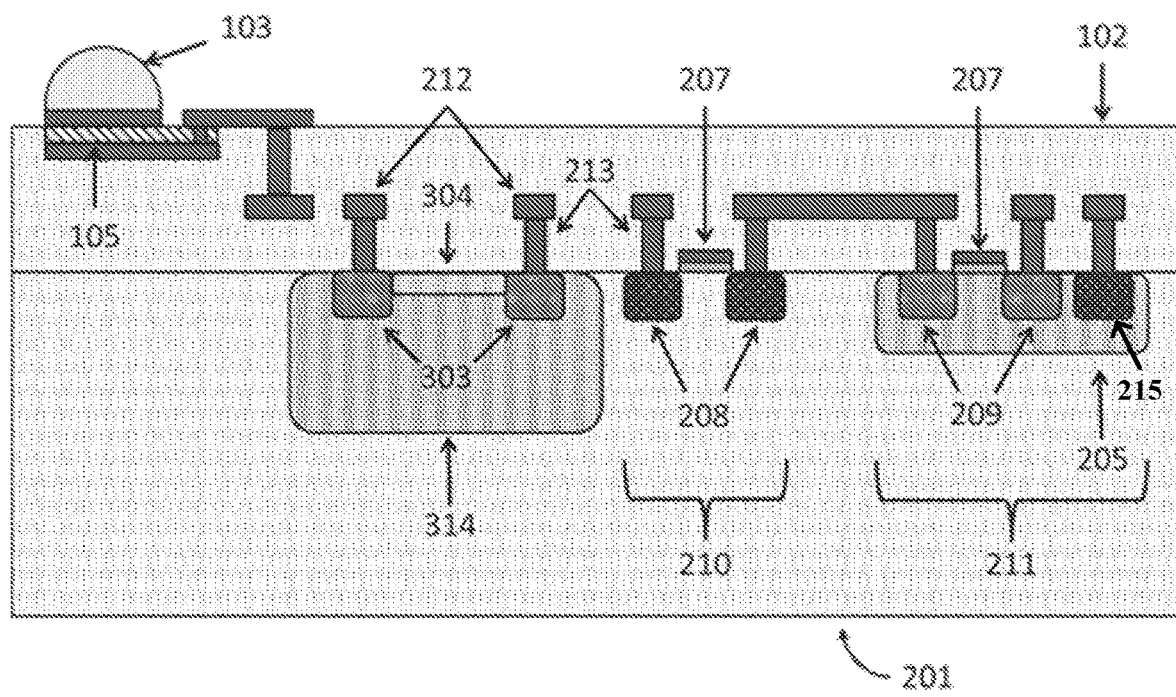
FIG. 3 is a cross-sectional view of an integrated n-type MEMS-CMOS force sensor using a piezoresistive sensing element (not to scale) according to implementations described herein.
Figure 4:
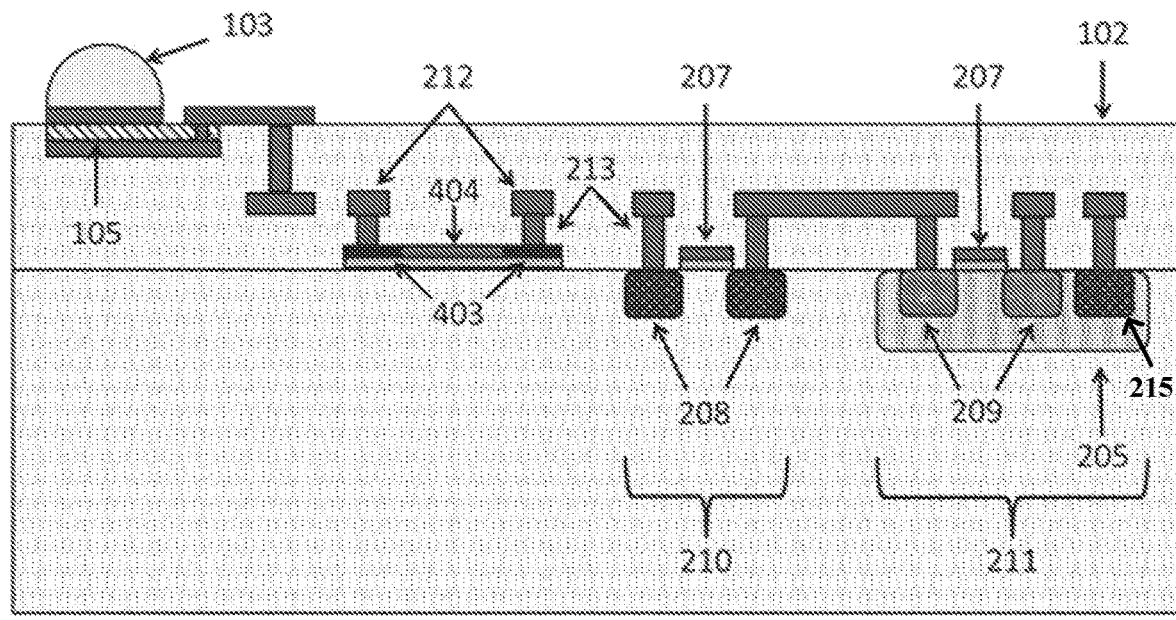
FIG. 4 is a cross-sectional view of an integrated p-type MEMS-CMOS force sensor using a polysilicon sensing element (not to scale) according to implementations described herein.

In addition, the MEMS force sensor 100 includes a plurality of piezoelectric sensing elements 105. The piezoelectric sensing elements 105 are located between the solder bumps 103 and the IMD 102. For example, a piezoelectric sensing element 105 can be formed on the IMD layer 102, and the solder bump 103 can be formed over the piezoelectric sensing element 105. The arrangement of a piezoelectric sensing element 105 and the IMD layer 102 is shown in FIGS. 2-4. Referring again to FIGS. 1A-1B, the piezoelectric sensing elements 105 are configured to convert a change in strain to an analog electrical signal (e.g., a second analog electrical signal) that is proportional to the change strain on the bottom surface of the substrate 101. The piezoelectric sensing elements 105 sense dynamic forces applied to the MEMS force sensor 100. The second analog electrical signal can be routed to digital circuitry (e.g., as shown in FIGS. 2-5) arranged on the bottom surface of the substrate 101. For example, the digital circuitry can be configured to, among other functions, convert the second analog electrical signal to a digital electrical output signal. Accordingly, the digital circuitry can be configured to convert the first and second analog electrical signals to respective digital electrical output signals. Additionally, the digital circuitry can be configured to store the respective digital electrical output signals in a buffer such as an on-chip buffer.

In one implementation, as depicted in FIG. 2, the cross section of a MEMS force sensor device is shown. The force sensor device of FIG. 2 is a MEMS force sensor using an integrated p-type MEMS-CMOS force sensor with a piezoresistive sensing element. The p-type silicon substrate 201 is a CMOS chip with both an n-type metal-oxide-semiconductor (nMOS) transistor 210 and a p-type metal-oxide-semiconductor (pMOS) transistor 211 fabricated on it. The p-type silicon substrate 201 can be a single continuous piece of material, i.e., the substrate can be monolithic. The nMOS source/drain 208 and pMOS source/drain 209 are formed through diffusion or implantation. As shown in FIG. 2, the pMOS source/drain 209 reside in an n-well region 205, which receives a voltage bias through a highly-doped n-type implant 215. Further, a gate contact 207 (e.g., poly silicon gate) forms the channel required for each of the nMOS transistor 210 and pMOS transistor 211. It should be understood, however, that similar CMOS processes can be adapted to other starting materials, such as an n-type silicon substrate. Additionally, although a silicon substrate is provided as an example, this disclosure contemplates that the substrate can be made from a material other than silicon. This disclosure contemplates that the MEMS force sensor can include a plurality of nMOS and pMOS devices. The nMOS and pMOS devices can form various components of the digital circuitry (e.g., CMOS circuitry). The digital circuity can optionally include other components, which are not depicted in FIG. 2, including, but not limited to, bipolar transistors; metal-insulator-metal ("MIM") and metal-oxide-semiconductor ("MOS") capacitors; diffused, implanted, and polysilicon resistors; and/or diodes. The digital circuitry can include, but is not limited to, one or more of a differential amplifier or buffer, an analog-to-digital converter, a clock generator, non-volatile memory, and a communication bus. For example, the digital circuitry can include an on-chip buffer for storing the respective digital electrical output signals.

In addition to the nMOS and pMOS transistors 210 and 211 shown in FIG. 2, a lightly doped n-type piezoresistive sensing element 204 and a heavily doped n-type contact region 203 are formed on the same p-type silicon substrate 201. In other words, the piezoresistive sensing element and digital circuitry can be disposed on the same monolithic substrate. Accordingly, the process used to form the piezoresistive sensing element can be compatible with the process used to form the digital circuitry. The lightly doped n-type piezoresistive sensing element 204 and heavily doped n-type contact region 203 can be formed by way of either diffusion, deposition, or implant patterned with a lithographic exposure process. The MEMS force sensor can also include a piezoelectric sensing element 105, which can be disposed on the IMD 102 layer and underneath the solder ball 103. The piezoelectric sensing element 105 can be formed after completion of the integrated circuit process. Metal 212 and contact 213 layers can be provided to create electrical connections between nMOS and pMOS transistors 210 and 211, piezoresistive sensing element 204, and piezoelectric sensing element 105. Accordingly, the MEMS force sensor includes a piezoresistive sensing element, a piezoelectric sensing element, and digital circuitry all on the same chip.

In another implementation, as depicted in FIG. 3, the cross section of a MEMS force sensor device is shown. The force sensor device of FIG. 3 is a MEMS force sensor using an integrated n-type MEMS-CMOS force sensor with a piezoresistive sensing element. The p-type silicon substrate 201 is a CMOS chip with both nMOS transistor 210 and pMOS transistor 211 fabricated on it. The p-type silicon substrate 201 can be a single continuous piece of material, i.e., the substrate can be monolithic. The nMOS source/drain 208 and pMOS source/drain 209 are formed through diffusion or implantation. As shown in FIG. 3, the pMOS source/drain 209 reside in an n-well region 205, which receives a voltage bias through a highly-doped n-type implant 215. Further, a gate contact 207 (e.g., poly silicon gate) forms the channel required for each of the nMOS transistor 210 and pMOS transistor 211. It should be understood, however, that similar CMOS processes can be adapted to other starting materials, such as an n-type silicon substrate. Additionally, although a silicon substrate is provided as an example, this disclosure contemplates that the substrate can be made from a material other than silicon. This disclosure contemplates that the MEMS force sensor can include a plurality of nMOS and pMOS devices. The nMOS and pMOS devices can form various components of the digital circuitry (e.g., CMOS circuitry). The digital circuity can optionally include other components, which are not depicted in FIG. 3, including, but not limited to, bipolar transistors; metal-insulator-metal ("MIM") and metal-oxide-semiconductor ("MOS") capacitors; diffused, implanted, and polysilicon resistors; and/or diodes. The digital circuitry can include, but is not limited to, one or more of a differential amplifier or buffer, an analog-to-digital converter, a clock generator, non-volatile memory, and a communication bus. For example, the digital circuitry can include an on-chip buffer for storing the respective digital electrical output signals.

In addition to the nMOS and pMOS transistors 210 and 211 shown in FIG. 3, a lightly doped p-type piezoresistive sensing elements 304 and a heavily doped n-type contact region 303 are formed on the same p-type silicon substrate 201 inside an n-well 314. In other words, the piezoresistive sensing element and digital circuitry can be disposed on the same monolithic substrate. Accordingly, the process used to form the piezoresistive sensing element can be compatible with the process used to form the digital circuitry. The n-well 314, lightly doped n-type piezoresistive sensing element 304, and heavily doped n-type contact region 303 can be formed by way of either diffusion, deposition, or implant patterned with a lithographic exposure process. The MEMS force sensor can also include a piezoelectric sensing element 105, which is disposed on the IMD 102 layer and underneath the solder ball 103. The piezoelectric sensing element 105 can be formed after completion of the integrated circuit process. Metal 212 and contact 213 layers can be provided to create electrical connections between the nMOS and pMOS transistors 210 and 211, piezoresistive sensing element 304, and piezoelectric sensing element 105. Accordingly, the MEMS force sensor includes a piezoresistive sensing element, a piezoelectric sensing element, and digital circuitry all on the same chip.

In yet another implementation, as depicted in FIG. 4, the cross section of a MEMS force sensor device is shown. The force sensor device of FIG. 4 is an MEMS force sensor using an integrated p-type MEMS-CMOS force sensor with a polysilicon sensing element. The p-type silicon substrate 201 is a CMOS chip with both nMOS transistor 210 and pMOS transistor 211 fabricated on it. The p-type silicon substrate 201 can be a single continuous piece of material, i.e., the substrate can be monolithic. The nMOS source/drain 208 and pMOS source/drain 209 are formed through diffusion or implantation. As shown in FIG. 4, the pMOS source/drain 209 reside in an n-well region 205, which receives a voltage bias through a highly-doped n-type implant 215. Further, a gate contact 207 (e.g., poly silicon gate) forms the channel required for each of the nMOS transistor 210 and pMOS transistor 211. It should be understood, however, that similar CMOS processes can be adapted to other starting materials, such as an n-type silicon substrate. Additionally, although a silicon substrate is provided as an example, this disclosure contemplates that the substrate can be made from a material other than silicon. This disclosure contemplates that the MEMS force sensor can include a plurality of nMOS and pMOS devices. The nMOS and pMOS devices can form various components of the digital circuitry (e.g., CMOS circuitry). The digital circuity can optionally include other components, which are not depicted in FIG. 4, including, but not limited to, bipolar transistors; metal-insulator-metal ("MIM") and metal-oxide-semiconductor ("MOS") capacitors; diffused, implanted, and polysilicon resistors; and/or diodes. The digital circuitry can include, but is not limited to, one or more of a differential amplifier or buffer, an analog-to-digital converter, a clock generator, non-volatile memory, and a communication bus. For example, the digital circuitry can include an on-chip buffer for storing the respective digital electrical output signals.

In addition to the nMOS and pMOS transistors 210 and 211 of FIG. 4, a doped piezoresistive sensing element 404 and a silicided contact region 403 are formed with the same polysilicon gate material used for the nMOS transistor 210 and pMOS transistor 211. In other words, the piezoresistive sensing element and digital circuitry can be disposed on the same monolithic substrate. The MEMS force sensor can also include a piezoelectric sensing element 105, which is disposed on the IMD layer 102 and underneath solder ball 103. The piezoelectric sensing element 105 can be formed after completion of the integrated circuit process. Metal 212 and contact 213 layers can be used to create electrical connections between nMOS and pMOS transistors 210 and 211, piezoresistive sensing element 404, and piezoelectric sensing element 105. Accordingly, the MEMS force sensor includes a piezoresistive sensing element, a piezoelectric sensing element, and digital circuitry all on the same chip.

Figure 5:
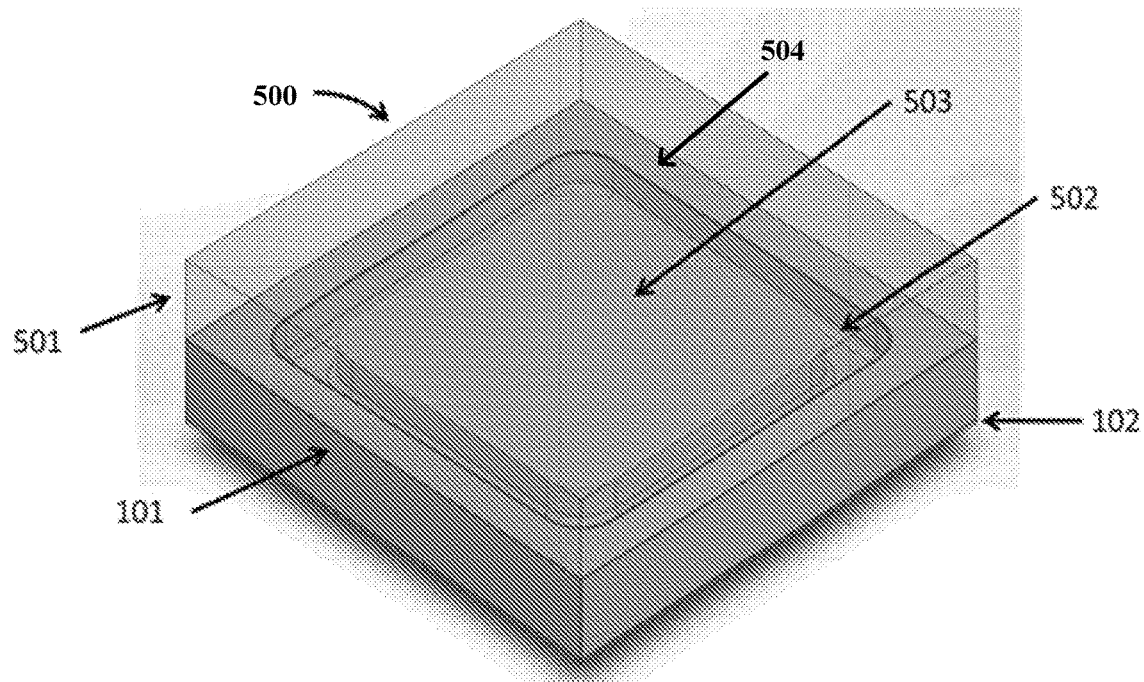
FIG. 5 is an isometric view of the top of another example MEMS force sensor according to implementations described herein.

In addition to the implementations described above, a stress amplification mechanism can be implemented on the substrate of the MEMS force sensor. For example, as depicted in FIG. 5, the MEMS force sensor 500 includes a substrate 101 with a cap 501 bonded to it. The substrate 101 and cap 501 can be bonded at one or more points along the surface formed by an outer wall 504 of the substrate 101. In other words, the substrate 101 and cap 501 can be bonded at a peripheral region of the MEMS force sensor 500. It should be understood that the peripheral region of the MEMS force sensor 500 is spaced apart from the center thereof, i.e., the peripheral region is arranged near the outer edge of the MEMS force sensor 500. Example MEMS force sensors where a cap and sensor substrate are bonded in peripheral region of the MEMS force sensor are described in U.S. Pat. No. 9,487,388, issued Nov. 8, 2016 and entitled "Ruggedized MEMS Force Die;" U.S. Pat. No. 9,493,342, issued Nov. 15, 2016 and entitled "Wafer Level MEMS Force Dies;" U.S. Patent Application Publication No. 2016/0332866 to Brosh et al., filed Jan. 13, 2015 and entitled "Miniaturized and ruggedized wafer level mems force sensors;" and U.S. Patent Application Publication No. 2016/0363490 to Campbell et al., filed Jun. 10, 2016 and entitled "Ruggedized wafer level mems force sensor with a tolerance trench," the disclosures of which are incorporated by reference in their entireties.

The cap 501 can optionally be made of glass (e.g., borosilicate glass) or silicon. The substrate 101 can optionally be made of silicon. Optionally, the substrate 101 (and its components such as, for example, the mesa, the outer wall, the flexure(s), etc.) is a single continuous piece of material, i.e., the substrate is monolithic. It should be understood that this disclosure contemplates that the cap 501 and/or the substrate 101 can be made from materials other than those provided as examples. This disclosure contemplates that the cap 501 and the substrate 101 can be bonded using techniques known in the art including, but not limited to, silicon fusion bonding, anodic bonding, glass frit, thermo-compression, and eutectic bonding.

In FIG. 5, the cap 501 is made transparent to illustrate the internal features. An inter-metal dielectric layer (IMD) 102 can be fabricated on a surface (e.g., bottom surface) of the substrate 101 to form integrated circuits. Additionally, a deep trench 502 is formed on the substrate 101 and serves as a stress amplification mechanism. The trench 502 can be etched by removing material from the substrate 101. Additionally, the trench 502 defines the outer wall 504 and mesa 503 of the substrate 101. The base of the trench 502 defines a flexure. The piezoelectric sensing elements can be formed on a surface of the flexure, which facilitates stress amplification. In FIG. 5, the trench 502 is continuous and has a substantially square shape. It should be understood that the trench can have other shapes, sizes, and/or patterns than the trench shown in FIG. 5, which is only provided as an example. Optionally, the trench 502 can form a plurality of outer walls and/or a plurality of flexures. An internal volume can be sealed between the cap 501 and substrate 101 (i.e., sealed cavity). The sealed cavity can be sealed between the cap 501 and the substrate 101 when bonded together. In other words, the MEMS force sensor 500 can have a sealed cavity that defines a volume entirely enclosed by the cap 501 and the substrate 101. The sealed cavity is sealed from the external environment. Example MEMS force sensors having a cavity (e.g., trench) that defines a flexible sensing element (e.g., flexure) are described in U.S. Pat. No. 9,487,388, issued Nov. 8, 2016 and entitled "Ruggedized MEMS Force Die;" U.S. Pat. No. 9,493,342, issued Nov. 15, 2016 and entitled "Wafer Level MEMS Force Dies;" U.S. Patent Application Publication No. 2016/0332866 to Brosh et al., filed Jan. 13, 2015 and entitled "Miniaturized and ruggedized wafer level mems force sensors;" and U.S. Patent Application Publication No. 2016/0363490 to Campbell et al., filed Jun. 10, 2016 and entitled "Ruggedized wafer level mems force sensor with a tolerance trench," the disclosures of which are incorporated by reference in their entireties.

A gap (e.g., air gap or narrow gap) can be arranged between the cap 501 and the mesa 503, which is arranged in the central region of the MEMS force sensor 500. The narrow gap serves as a force overload protection mechanism. The gap can be within the sealed cavity. For example, the gap can be formed by removing material from the substrate 101. Alternatively, the gap can be formed by etching a portion of the cap 501. Alternatively, the gap can be formed by etching a portion of the substrate 101 and a portion of the cap 501. The size (e.g., thickness or depth) of the gap can be determined by the maximum deflection of the flexure, such that the gap between the substrate 101 and the cap 501 will close and mechanically stop further deflection before the flexure is broken. The gap provides an overload stop by limiting the amount by which the flexure can deflect such that the flexure does not mechanically fail due to the application of excessive force.

Example MEMS force sensors designed to provide overload protection are described in U.S. Pat. No. 9,487,388, issued Nov. 8, 2016 and entitled "Ruggedized MEMS Force Die;" U.S. Pat. No. 9,493,342, issued Nov. 15, 2016 and entitled "Wafer Level MEMS Force Dies;" U.S. Patent Application Publication No. 2016/0332866 to Brosh et al., filed Jan. 13, 2015 and entitled "Miniaturized and ruggedized wafer level mems force sensors;" and U.S. Patent Application Publication No. 2016/0363490 to Campbell et al., filed Jun. 10, 2016 and entitled "Ruggedized wafer level mems force sensor with a tolerance trench," the disclosures of which are incorporated by reference in their entireties.

This disclosure contemplates that the existence of both piezoresistive and piezoelectric sensing element types can be utilized to improve sensitivity and resolution of the force sensing device. Piezoelectric sensors are known to be highly sensitive, however their response decays over time, making them more useful for sensing dynamic forces. Piezoresistive sensors, on the other hand, are more useful for sensing static forces. Piezoresistive sensors are known to be less sensitive than piezoelectric sensing elements. In force sensing applications, it is often necessary to determine the direct current ("DC") load being applied to the MEMS force sensor. In this case a piezoresistive sensing element, while less sensitive than the piezoelectric sensing element, is well-suited. In the implementations described herein, the presence of both the piezoresistive and piezoelectric sensing elements allows the MEMS force sensor to leverage two signal types and avoid the use of dead-reckoning algorithms, which become more inaccurate over time. Piezoelectric sensors are highly sensitive, but their operation depends on the generation of charge as stress on the sensing element changes. Piezoelectric sensors are not capable of detecting low frequency or DC signals, and as such, a static force will appear to decrease over time. To account for this, a filtered piezoresistive signal, which is inherently less sensitive but capable of low frequency and DC signal detection, can be used to measure the static forces that are acting on the MEMS force sensor, while a piezoelectric signal, which is more sensitive and capable of higher frequency detection, can be used to measure the dynamic forces acting on the MEMS force sensor. In other words, piezoresistive and piezoelectric sensors can be used in conjunction to detect both static and dynamic forces acting on the MEMS force sensor.

As described above, the digital circuitry can be configured to receive and process both the first analog electrical signal produced by the piezoresistive sensing element and the second analog electrical signal produced by the piezoelectric sensing element. The digital circuitry can be configured to convert the first and second analog electrical signals into respective digital output signals, and optionally store the digital output signals in an on-chip buffer. The digital circuitry can be configured to use the respective digital output signals in conjunction in order to improve sensitivity, accuracy, and/or resolution of the MEMS for sensors.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

The invention claimed is:

1. A microelectromechanical ("MEMS") force sensor, comprising:
   a sensor die configured to receive an applied force, wherein the sensor die comprises a top surface and a bottom surface opposite thereto,
   a piezoresistive sensing element arranged on the bottom surface of the sensor die, wherein the piezoresistive sensing element is configured to convert a strain to a first analog electrical signal that is proportional to the strain,
   a piezoelectric sensing element arranged on the bottom surface of the sensor die, wherein the piezoelectric sensing element is configured to convert a change in strain to a second analog electrical signal that is proportional to the change in strain, and
   digital circuitry arranged on the bottom surface of the sensor die, wherein the digital circuitry is configured to convert the first and second analog electrical signals to respective digital electrical output signals.

2. The MEMS force sensor of claim 1, wherein the piezoresistive sensing element is formed by diffusion or implantation.

3. The MEMS force sensor of claim 1, wherein the piezoresistive sensing element is formed by polysilicon processes from an integrated circuit process.

4. The MEMS force sensor of claim 1, further comprising a solder ball arranged on the bottom surface of the sensor die, wherein the piezoelectric sensing element is disposed between the solder ball and the sensor die.

5. The MEMS force sensor of claim 1, further comprising a plurality of electrical terminals arranged on the bottom surface of the sensor die, wherein the respective digital electrical output signals produced by the digital circuitry are routed to the electrical terminals.

6. The MEMS force sensor of claim 5, wherein the electrical terminals comprise solder bumps or copper pillars.

7. The MEMS force sensor of claim 1, wherein the digital circuitry is further configured to use the second analog electrical signal produced by the piezoelectric sensing element and the first analog electrical signal produced by the piezoresistive sensing element in conjunction to improve sensitivity and accuracy.

8. The MEMS force sensor of claim 7, wherein the first analog electrical signal produced by the piezoresistive sensing element measures static force applied to the MEMS force sensor.

9. The MEMS force sensor of claim 7, wherein the second analog electrical signal produced by the piezoelectric sensing element measures dynamic force applied to the MEMS force sensor.

10. The MEMS force sensor of claim 1, further comprising a cap attached to the sensor die at a surface defined by an outer wall of the sensor die, wherein a sealed cavity is formed between the cap and the sensor die.

11. The MEMS force sensor of claim 10, wherein the sensor die comprises a flexure formed therein, and wherein the flexure converts the applied force into the strain on the bottom surface of the sensor die.

12. The MEMS force sensor of claim 11, wherein the flexure is formed in the sensor die by etching.

13. The MEMS force sensor of claim 10, wherein a gap is arranged between the sensor die and the cap, and wherein the gap is configured to narrow with application of the applied force such that the flexure is unable to deform beyond its breaking point.

14. The MEMS force sensor of claim 1, further comprising an inter-metal dielectric layer arranged on the bottom surface of the sensor die.

15. The MEMS force sensor of claim 14, wherein the piezoelectric sensing element is arranged on the inter-metal dielectric layer.

16. The MEMS force sensor of claim 1, wherein the digital circuitry is further configured to store the respective digital electrical output signals to a buffer.

17. The MEMS force sensor of claim 16, wherein the digital circuitry comprises the buffer.

* * * * *